United States Patent
Patterson et al.

(10) Patent No.: US 8,787,074 B2
(45) Date of Patent: Jul. 22, 2014

(54) STATIC RANDOM ACCESS MEMORY TEST STRUCTURE

(75) Inventors: Oliver D. Patterson, Poughkeepsie, NY (US); Jin Zheng Wallner, Pleasant Valley, NY (US); Thomas A. Wallner, Pleasant Valley, NY (US); Shenzhi Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 333 days.

(21) Appl. No.: 13/273,271

(22) Filed: Oct. 14, 2011

(65) Prior Publication Data
US 2013/0094315 A1 Apr. 18, 2013

(51) Int. Cl.
| | |
|---|---|
| G11C 11/00 | (2006.01) |
| G11C 29/50 | (2006.01) |
| G11C 11/41 | (2006.01) |
| G11C 29/04 | (2006.01) |
| H01L 21/66 | (2006.01) |

(52) U.S. Cl.
CPC .......... *G11C 29/50008* (2013.01); *G11C 11/41* (2013.01); *G11C 2029/0403* (2013.01); *G11C 2029/5002* (2013.01); *H01L 22/34* (2013.01)
USPC .......... 365/154; 365/174; 365/201; 365/188; 365/200; 324/754.22

(58) Field of Classification Search
USPC .......... 365/154, 174, 201, 188, 200; 324/754.22
See application file for complete search history.

(56) References Cited

U.S. PATENT DOCUMENTS

| | | | |
|---|---|---|---|
| 6,147,507 A | 11/2000 | Shabde et al. | |
| 6,924,484 B1 | 8/2005 | Wang et al. | |
| 6,943,569 B1 | 9/2005 | Pressley et al. | |
| 7,071,468 B2 | 7/2006 | Miyai et al. | |

(Continued)

FOREIGN PATENT DOCUMENTS

KR   20070003037 A   1/2007

OTHER PUBLICATIONS

L.M. Gignac et al., "Imaging and Analysis of Subsurface Cu Interconnects by Detecting Backscattered Electrons in the Scanning Electron Microscope," Journal of Applied Physics, vol. 97, No. 11, pp. 114506-1-114506-9; publication date Jun. 1, 2005.
M, Matsui, et al., "Detecting Defects in Cu Metallization Structures by Electron-Beam Wafer Inspection," Journal of The Electrochemical Society, vol. 151, No. (6), pp. G440-G442; publication date Jun. 2004.

*Primary Examiner* — Han Yang
(74) *Attorney, Agent, or Firm* — Cantor Colburn LLP; William Steinberg

(57) ABSTRACT

A static random access memory (SRAM) test structure includes a p-type source/drain implant region comprising contacts (CAs), wherein the CAs in the p-type source/drain implant region comprise a first plurality of bit line, ground, and node CAs, and wherein the CAs in the p-type source/drain implant region are grounded during an inspection of the SRAM test structure; and an ungrounded region, the ungrounded region being distinct from the p-type source/drain implant region and being ungrounded during the inspection of the SRAM test structure, the ungrounded region comprising contacts (CAs) and rectangular contacts (CArecs) comprising a second plurality of bit line, ground, and node CAs, and further comprising a first plurality of $V_{dd}$ CAs and rectangular contacts (CArecs), and wherein a CA or CArec in the ungrounded region is grounded during the inspection in the event of a short to a CA in the p-type source/drain implant region.

20 Claims, 9 Drawing Sheets

(56) References Cited

U.S. PATENT DOCUMENTS

| | | |
|---|---|---|
| 7,679,083 B2 | 3/2010 | Sun et al. |
| 7,772,867 B2 | 8/2010 | Guldi et al. |
| 2007/0210306 A1 | 9/2007 | Molinelli Acocella et al. |
| 2009/0102501 A1* | 4/2009 | Guldi et al. .................. 324/765 |
| 2010/0235114 A1 | 9/2010 | Levy et al. |
| 2010/0308220 A1 | 12/2010 | Chou et al. |
| 2011/0013826 A1 | 1/2011 | Xiao |

* cited by examiner

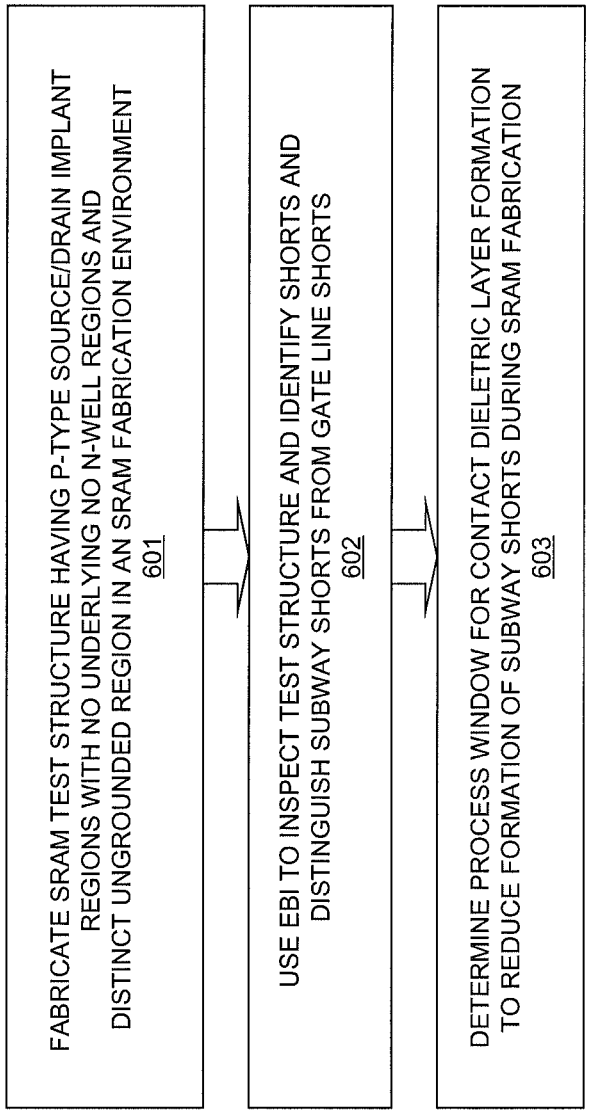

STATIC RANDOM ACCESS MEMORY TEST STRUCTURE

BACKGROUND

This disclosure relates generally to the field of semiconductor manufacturing, and in particular, to test structures for diagnosing contact shorts in a static random access memory (SRAM) device.

In the manufacture of semiconductors, processing induced defects, which result in physical defects within the semiconductor product, continue to be a problem. Exemplary of processing induced defects that cause circuit failure are open circuits in conductive lines and short circuits between adjacent conductive lines.

With the improvements in lithographic imaging processes, a semiconductor wafer may be provided with increasingly fine features that allow for smaller device dimensions and higher density devices. However, these features are often smaller than the wavelength of light used to transfer the pattern onto the wafer. As features become increasingly smaller, it has become increasingly more difficult to accurately transfer the pattern onto the wafer.

Conventional approaches aimed at solving the above problem include the use of phase-shifted masks and assist features on the mask. Phase-shifted masks selectively alter the phase of the light transmitted through the mask in order to improve the resolution of the features on the wafer. Assist features, by contrast, are used to pattern isolated high aspect features by nesting these otherwise isolated features in order to take advantage of photoresist and tools which are optimized to pattern nested features.

Another approach for minimizing process-induced defects has been through the use of fabricating test structures during the integrated circuit manufacturing process. These test structures serve to collect data on the health of the semiconductor structure. The principal reason for this is that the integrated circuits themselves cannot be probed because the interconnections in the device are neither accessible electrically, nor can the regions be isolated from one another to provide accurate data. The typical monolithic integrated semiconductor circuit involves such a dense pattern of impurity regions and metallurgy interconnecting them that the components cannot be readily isolated for testing purposes. Thus, semiconductor designers have found it necessary to design test structures where different components of the semiconductor process can be individually evaluated.

One manufacturing approach is the fabrication of defect monitors on the same wafers on which the actual semiconductor devices are fabricated. In this manner, the defect monitors are fabricated under the same processing environment and at the same time as the actual semiconductor devices, such that these defect monitors more accurately replicate the processing induced defects in the actual products.

These defect monitors are typically fabricated within the kerf or discardable portion of the semiconductor wafer, and may include a metal serpentine line, one or more interdigitated metal lines, and/or one or more metal combs. As for the serpentine metal line, electrical continuity is checked whereby if a current cannot flow through the serpentine line, then an indication is made that the serpentine line is broken. Electrical continuity is also checked between the interdigitated metal lines and/or one or more metal combs, whereby if a current can flow between such lines or combs, then this implies that there is bridging (or shorting) across the gap where there should not be any conductors.

The simplistic design of most electrical defect process monitors, however, samples only a fraction of the design space and process development, and often does not provide an exact location of where the actual defects reside within the semiconductor wafer. In particular, current electrical defect monitors may be able to test for and locate defects in the contact array region of the device; however, they do not precisely pinpoint exactly where these electrical defects reside within such region. That is, typical defect test monitors are limited to locating an electrical defect within the contact array region, whereby the located defect may reside between two adjacent contacts, between two adjacent metal lines residing above the contacts, or even between two adjacent polysilicon lines residing below the contacts. As such, once an electrical defect is located within this region of the wafer, it is often necessary to use non-electrical methods, such as physical examination, for locating exactly where the electrical defect resides in the wafer. Not only are these conventional electrical defect detection methods extremely time consuming, but they also do not isolate contact-to-contact shorts from the variety of other types of electrical defects residing within this region of the wafer.

Thus, while current test structures may be useful for limited purposes, there is still a need in the art for improved and more reliable test structures that will enhance the efficiency of the semiconductor manufacturing process, and in particular, will quickly and easily isolate contact-to-contact shorts from various other electrical defects within a wafer.

Additionally, as transistor size scales down, it becomes more challenging to fill the canyon that is located between the gate structures on a semiconductor wafer with the contact dielectric layers. The process window for contact dielectric formation is relatively small, and variations in shallow trench isolation (STI) recess depth, gate length, spacer shape and contact dielectric conformality may result in the presence of voids in the contact dielectric. An example of such a void is shown in FIG. 1, which shows a cross section of a portion of a SRAM semiconductor device 100 including a void 107. Semiconductor device 100 includes a p-type substrate 101, with STI regions 102 formed in the substrate 101. Source/drain regions, including n-type source/drain implanted regions 103 located in p-type wells 110, p-type source/drain regions 104 located in the n-type wells 111, and gate stacks 106 are formed on the p-type substrate 101. Contacts 105 contact the source/drain regions 103/104. The device 100 is covered in contact dielectric layers, including nitride layer 108 and oxide layer 109. Void 107 occurs during formation of the nitride contact dielectric layer 108, and runs parallel to gate stacks 106. Void formation may also occur in oxide layer if the nitride layer is relatively thin. A void such as void 107 may be filled with a conductive material such as aluminum (Al), titanium nitride (TiN) and/or tungsten (W) during subsequent metallization of the semiconductor device; this kind of defect (referred to as a subway) can cause contact-to-contact (CA-CA) shorts and yield degradation. It is important to detect subway defects as early in the process sequence as possible.

Test structures including a comb structure have been developed to detect subways at the first metal level (M1). However, the turnaround time may be relatively long for such test structures and the signal can be clouded by variations introduced by the M1 module (like M1-M1 shorts). A test structure that includes a comb structure is not capable of distinguishing between direct CA-CA shorts due to the presence of a subway and indirect CA-CA shorts that are formed by contact-to-gate line (CA-PC) shorts. A detected short may be located anywhere within the comb structure, so failure analysis requires additional steps to pinpoint the location of a detected short.

Comb test structures also lack the ability to monitor for the presence of subways in a semiconductor device that comprises a static random access memory (SRAM), which may be more prone to subway formation due to relatively tight device density.

Direct inspection of SRAM using e-beam inspection (EBI) has also been developed to detect subways before the first metal level (M1). By observing grounded contacts under EBI, the presence of some subways in SRAM may be determined. However, EBI may only detect a subset of subways, and some of the undetected subways could be more susceptible, thus causing device failure. Secondly, EBI is not able to differentiate a direct subway fail versus other potential failure mechanisms, such as indirect shorts between contacts through adjacent gate lines.

A typical SRAM cell layout is shown in FIG. 2A. Region 201 covers one bit of a SRAM device 200A, including p-type source/drain implant regions 202 and n-type source-drain implant region 203. Region 204 represents a diffusion area on which transistors are formed with the p-type source/drain implanted regions 202. Region 205 represents a gate area that forms the controlling gate of the transistor in region 204. Three different types of contacts are present in the SRAM device 200B. Regular contact (CA) 206, connecting to a diffusion area 204, may be bright under EBI depending on the ground conditions. Rectangular contact (CArec) 207 provides connection between diffusion, gate and metal level. Regular contact 208, connecting to a gate line, is isolated from the diffusion area and thus always ungrounded in EBI.

An example of a SRAM device 200B including subways is shown in FIG. 2B. SRAM device 200B includes a p-type source/drain implant region 211 that is located on an n-type well (such as n-type well 111 of FIG. 1) and n-type source/drain implant region 212 that is located on the p-type well (such as p-type well 110 of FIG. 1). The p-type source/drain implant regions 211 include both CAs 213 and rectangular CAs (CArecs) 214. CArecs 214 are contacts that bridge both a source/drain and a gate line, such as gate line 215. For bulk semiconductors under positive mode EBI conditions, the CAs in p-type region 211 will appear bright because the p-type region 211 will be forward biased to the n-well that is located under the p-type region 211 which serves as a virtual ground. N-type source/drain implant region 212 includes CAs 216 (which may be node or bit line or ground CAs), and word line CAs 217. CAs in n-type region 212 will typically appear dark during EBI because the junction between the n-type region 212 and the p-well located under the n-type region 212 will be reverse biased. Shorts in the SRAM device 200B include direct CA-CA subway shorts 218, 219, and 220, and indirect CA-CA short (i.e., CA-PC short) 221. Subway 219 will cause CA 216 to appear bright under EBI. However, because the gate lines in p-type source/drain implant region 211, such as gate line 215, are grounded to a p-type source/drain by a CArec 214, an indirect CA-CA short 221 though the gate line 215 will cause CA 216 to become grounded and appear bright under EBI. Therefore, the indirect CA-CA short 221 will be indistinguishable from the subway short 219. Subways 218 and 220 cannot be detected by EBI because either end of subway 218, and either end of subway 220, is at the same potential during EBI.

BRIEF SUMMARY

In one aspect, a static random access memory (SRAM) test structure includes a p-type source/drain implant region comprising contacts (CAs) located in the p-type source/drain implant region, wherein the CAs in the p-type source/drain implant region comprise a first plurality of bit line, ground, and node CAs in the SRAM test structure, and wherein the CAs in the p-type source/drain implant region are grounded during an inspection of the SRAM test structure; and an ungrounded region, the ungrounded region being distinct from the p-type source/drain implant region and being ungrounded during the inspection of the SRAM test structure, the ungrounded region comprising contacts (CAs) and rectangular contacts (CArecs) comprising a second plurality of bit line, ground, and node CAs, and further comprising a first plurality of $V_{dd}$ CAs and rectangular contacts (CArecs), wherein a CArec simultaneously contacts a gate line and a source/drain, and wherein a CA or CArec in the ungrounded region is grounded during the inspection in the event of a short to a CA in the p-type source/drain implant region.

In another aspect, a method for short detection using SRAM test structure includes inspecting the SRAM test structure to detect the presence of a short, wherein the SRAM test structure comprises a p-type source/drain implant region comprising contacts (CAs) located in the p-type source/drain implant region, wherein the CAs in the p-type source/drain implant region comprise a first plurality of bit line, ground, and node CAs in the SRAM test structure, and wherein the CAs in the p-type source/drain implant region are grounded during an inspection of the SRAM test structure; and an ungrounded region, the ungrounded region being distinct from the p-type source/drain implant region and being ungrounded during the inspection of the SRAM test structure, the ungrounded region comprising contacts (CAs) and rectangular contacts (CArecs) comprising a second plurality of bit line, ground, and node CAs, and further comprising a first plurality of $V_{dd}$ CAs and rectangular contacts (CArecs), wherein a CArec simultaneously contacts a gate line and a source/drain, and wherein a CA or CArec in the ungrounded region is grounded during the inspection in the event of a short to a CA in the p-type source/drain implant region; and determining whether the detected short comprises a subway in a contact dielectric layer of the SRAM test structure or a contact-to-gate line short based on the inspection.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 6 is a flowchart of a method for short detection using a SRAM test structure.

DETAILED DESCRIPTION

Embodiments of a SRAM test structure, and a method of detecting shorts using a SRAM test structure, are provided, with exemplary embodiments being discussed below in detail. Subway defects in a SRAM test structure may be detected after contact (CA) formation by using e-beam inspection (EBI), which induces a positive charge in the test structure, causing CAs located on a p-type source/drain implant region, which are grounded during the EBI, to appear bright. The n-well is omitted from underneath the p-type source/drain implant region in the SRAM test structure. If a CA located in other portions of the SRAM test structure appears bright, the presence of a short to a CA located on the p-type source/drain region is indicated. The test structure is designed such that the exact location of a short in the test structure may be determined, and direct CA-CA subway shorts may be distinguished from indirect CA-CA shorts through the gate line (PC). By varying the design dimensions of the test structure, the process window for forming the contact dielectric layers so as to avoid subway formation during the SRAM fabrication process may also be assessed.

Figure 1:
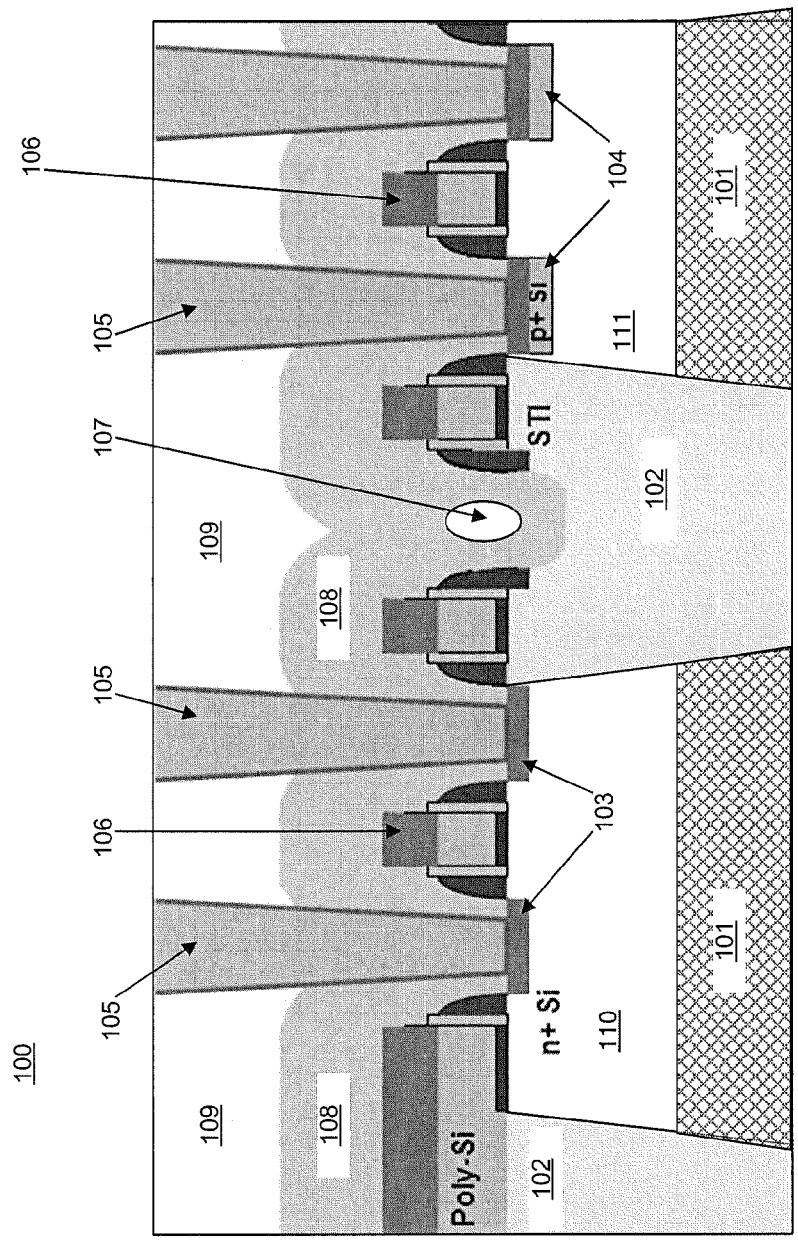
FIG. 1 is a cross-sectional view of an embodiment of a semiconductor device including a subway void according to the prior art.
Figure 2A:
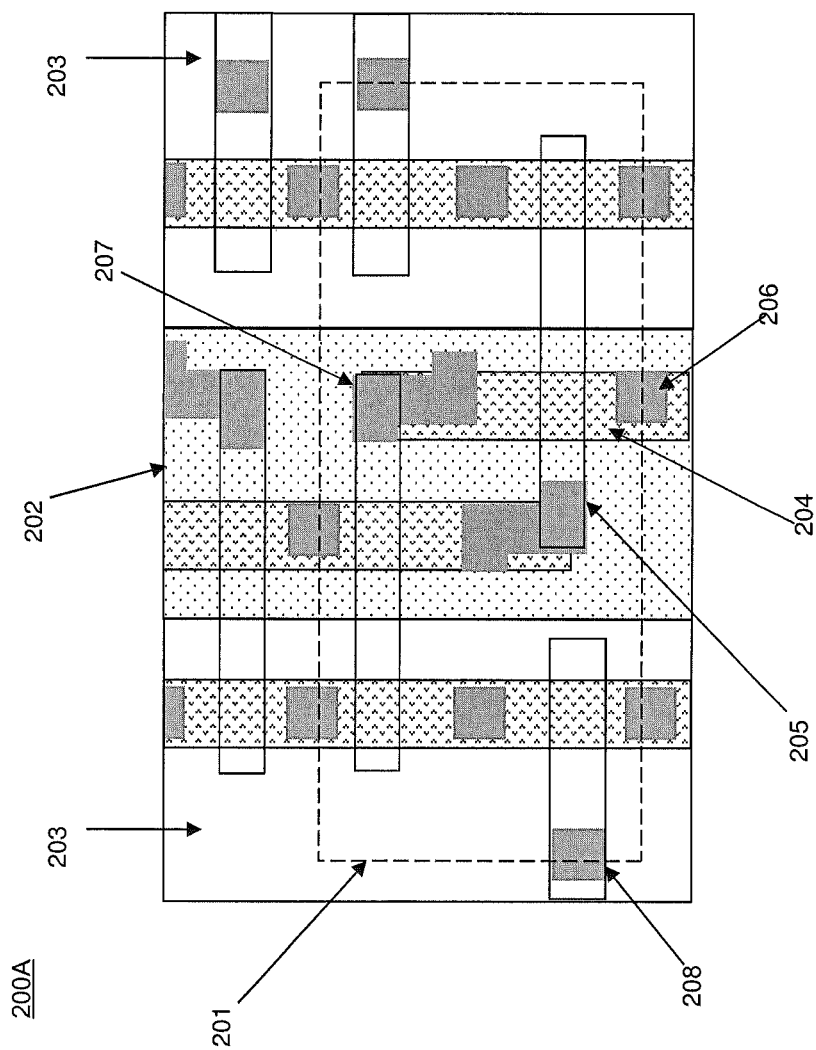
FIG. 2A is a top view of a SRAM cell layout according to the prior art.
Figure 2B:
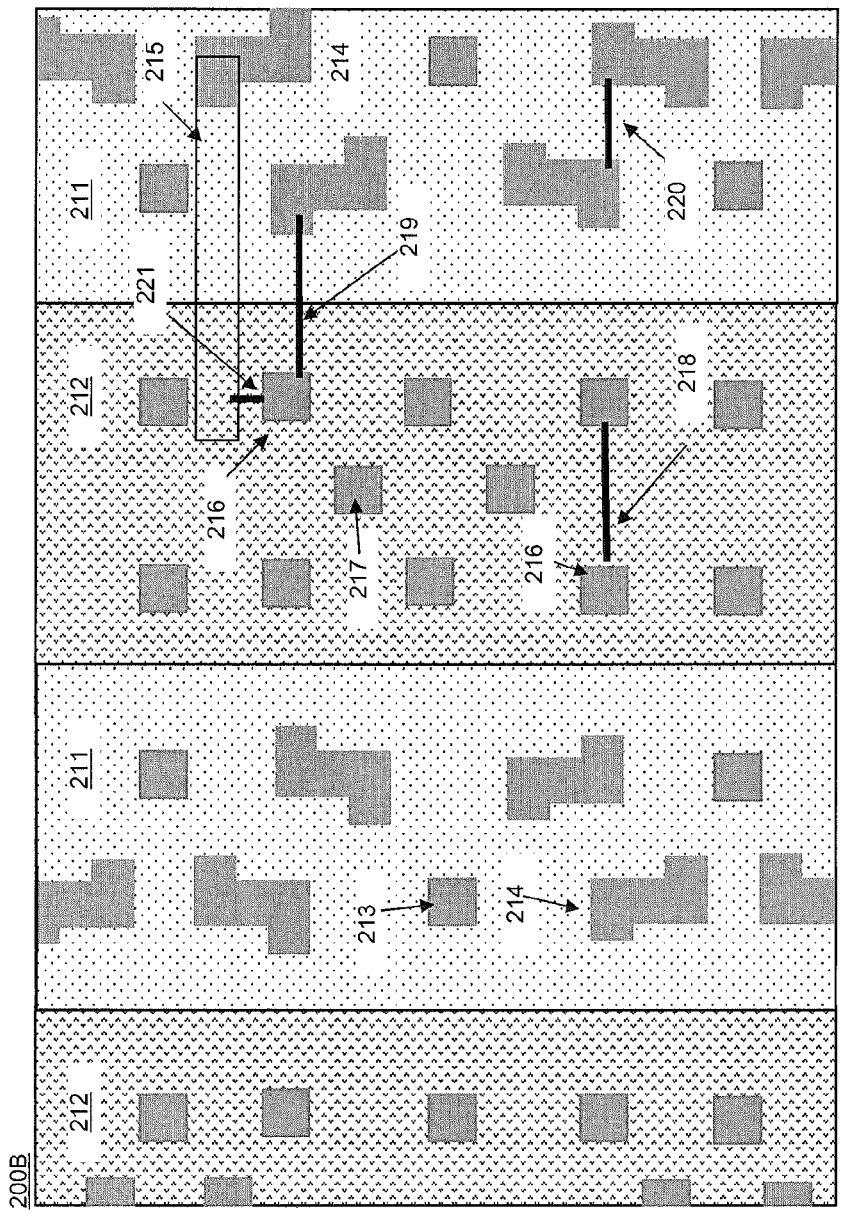
FIG. 2B is a top view of a SRAM device including subways according to the prior art.

To distinguish between different types of shorts in a SRAM test structure, the n-type well that is normally located under the p-type source/drain implant regions in regular SRAM is removed. In some embodiments, there may be no well underneath the p-type source/drain implant region; in other embodiments, there may be a p-well underneath the p-type source/drain implant region. Omitting the n-well under the p-type source/drain implant regions allows the p-type source/drain implant regions to be directly electrically connected to the substrate during EBI, providing a large ground and a relatively large potential difference between the p-type source/drain implant regions other portions of the test structure. Additionally, an ungrounded region comprising CAs and CArecs is formed in the test structure. The ungrounded region may be an n-type source/drain implant region, or an undoped region in various embodiments. Because subway formation is sensitive to topology, the topology of the test structure (STI recess/spacer shape) should be kept the same as actual SRAM by avoiding modifying layers other than the source/drain implant layers and well implant layers through either a Boolean method or a custom layer method. The CAs in the p-type source/drain region will be grounded to the p-type substrate and look bright during EBI. If other CAs or CArecs not located in the p-type source/drain region turn bright, that means there is a leakage path (e.g., a subway) from the p-type source/drain region. Embodiments of SRAM test structures 300 and 400 are discussed below in FIGS. 3A-B and 4A-B. FIGS. 3A-B and 4A-B are shown for illustrative purposes only; a SRAM test device may include any appropriate gate line, CA, and CArec layout that corresponds to a SRAM layout. The CAs may comprise any of node, bit line, word line, ground, or $V_{dd}$ CAs, as appropriate. In the discussion of FIGS. 3A-B and 4A-B, only these three types of contacts and the corresponding implant levels are shown. Gate lines are shown when necessary, and the diffusion area (such as diffusion area 204 of FIG. 2) is not shown to reduce clutter in the figures.

Figure 3A:
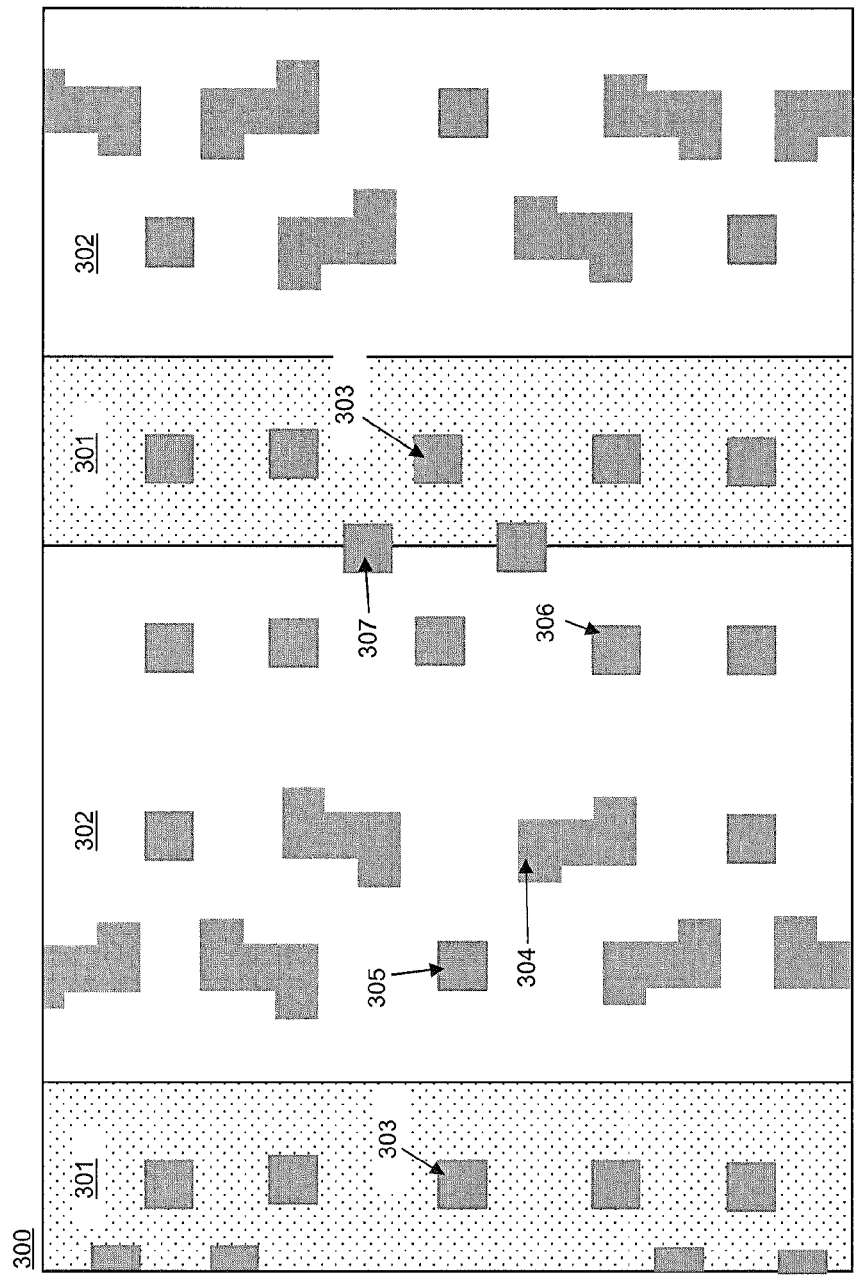
FIGS. 3A-B are top views of an embodiment of a SRAM test structure.

A first embodiment of a SRAM test structure 300 is shown in FIG. 3A. SRAM test structure 300 includes p-type source/drain implant region 301 and ungrounded region 302. P-type source/drain implant region 301 includes CAs 303, which may be node CAs, bit line CAs or ground CAs. There is no n-well located under the p-type source/drain implant region 301. In some embodiments, there may be no well underneath the p-type source/drain implant region 301; in other embodiments, there may be a p-well underneath the p-type source/drain implant region 301. Ungrounded region 302 may include an undoped region or an n-type source/drain implant region in various embodiments. Ungrounded region 302 is ungrounded under EBI, and includes CArecs 304, VDD CAs 305 and CAs 306, which may be node CAs, bit line CAs or ground CAs. Word line CAs 307 straddles the p-type source/drain implant region 301 and the ungrounded region 302. During EBI, the CAs 303 in the p-type source/drain implant region 301 will be grounded to the p-type substrate, and will appear bright. If any of CArecs 304, or CAs 305 or 306, also appear bright during EBI, the presence of a leakage path, which may be a gate line or a subway short, is indicated. CArecs 304, or CAs 305 or 306, shorting to gate lines alone will not appear bright unless there is also a short between the same gate line and a CA such as CA 303 in p-type source/drain implant region 301, as the gate lines are not grounded by the CArecs, which are in the ungrounded region 302. A gate line simultaneously shorting to a CA 303 in the p-type source/drain implant region 301 and a CA or CArec not in the p-type source/drain implant region 301 may be determined not to be a subway during EBI because a corresponding additional word line CA 307 or CArec 304 that is connected to the gate line will also appear bright.

Figure 3B:
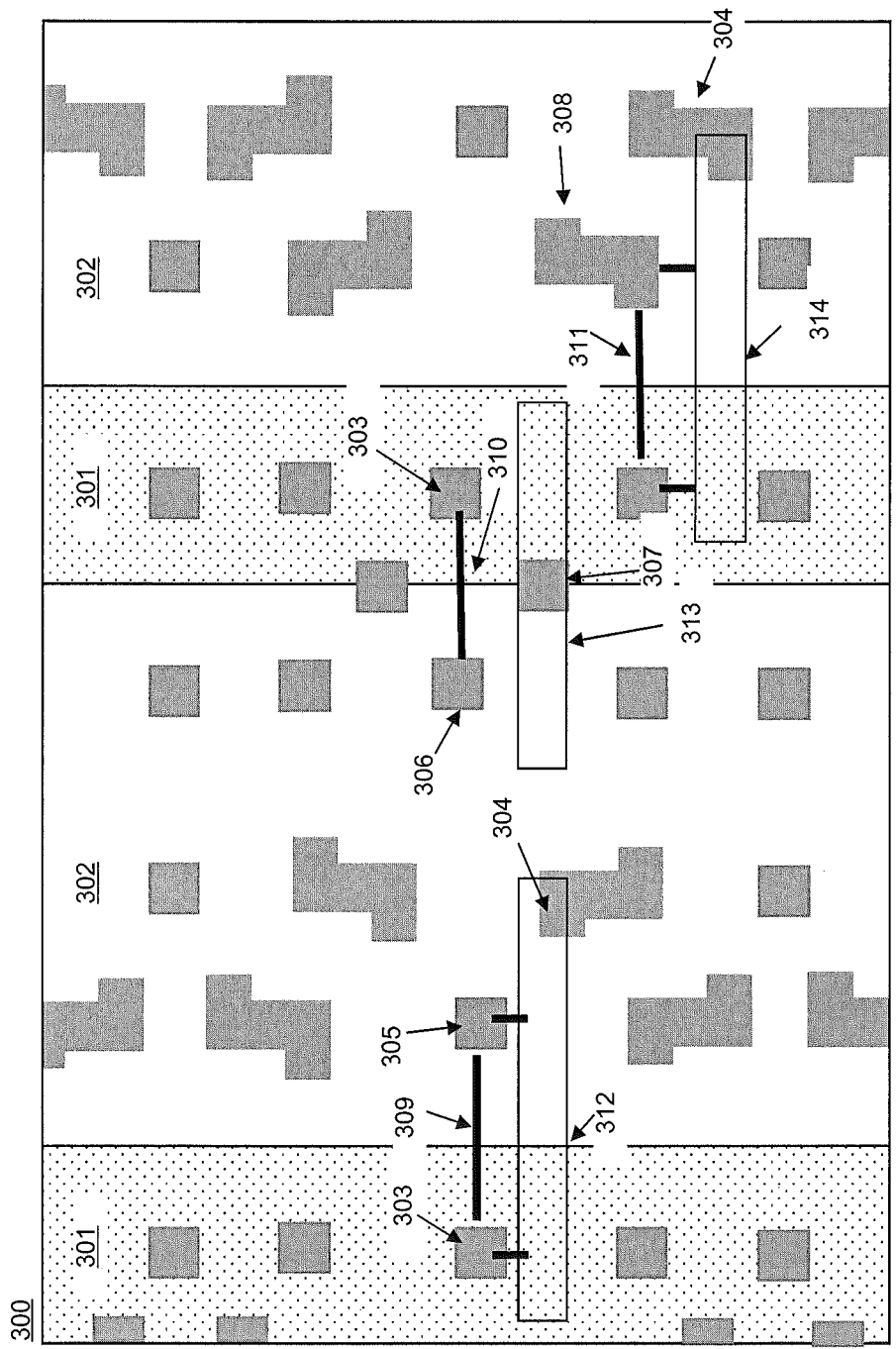

Some example shorts in the test structure 300 that may be detected using EBI are shown in FIG. 3B. Subway short 309 connects a CA 305 (which may comprise a $V_{dd}$ CA) in the ungrounded region 302 with a CA 303 in the p-type source/drain implant region. Subway short 309 may be distinguished from a short of both CA 303 and 305 to gate line 312, which also connects a CArec 304 in the ungrounded region 302 with a CA 303 in the p-type source/drain implant region, because the CArec on gate line 312 will also appear bright under EBI. Subway short 310 connects a CA 306 (which may comprise a bit line CA or a node CA) in the ungrounded region 302 with a CA 303 in the p-type source/drain implant region 301. Subway short 310 may be distinguished from a short of both CA 303 and 306 to gate line 313, which also connects a wordline CA 307 to CA 303 in the p-type source/drain implant region 301, because wordline CA 307 on gate line 313 will also appear bright under EBI. Subway short 311 connects a CArec 308 in ungrounded region 302 with a CA 303 in the p-type source/drain implant region 301. Subway short 311 may be distinguished from a short to gate line 314, which also connects a CArec 304 in the ungrounded region 302 with a CA 304 in the p-type source/drain implant region 301, because a second CArec 304 on gate line 314 will also appear bright under EBI.

Figure 4A:
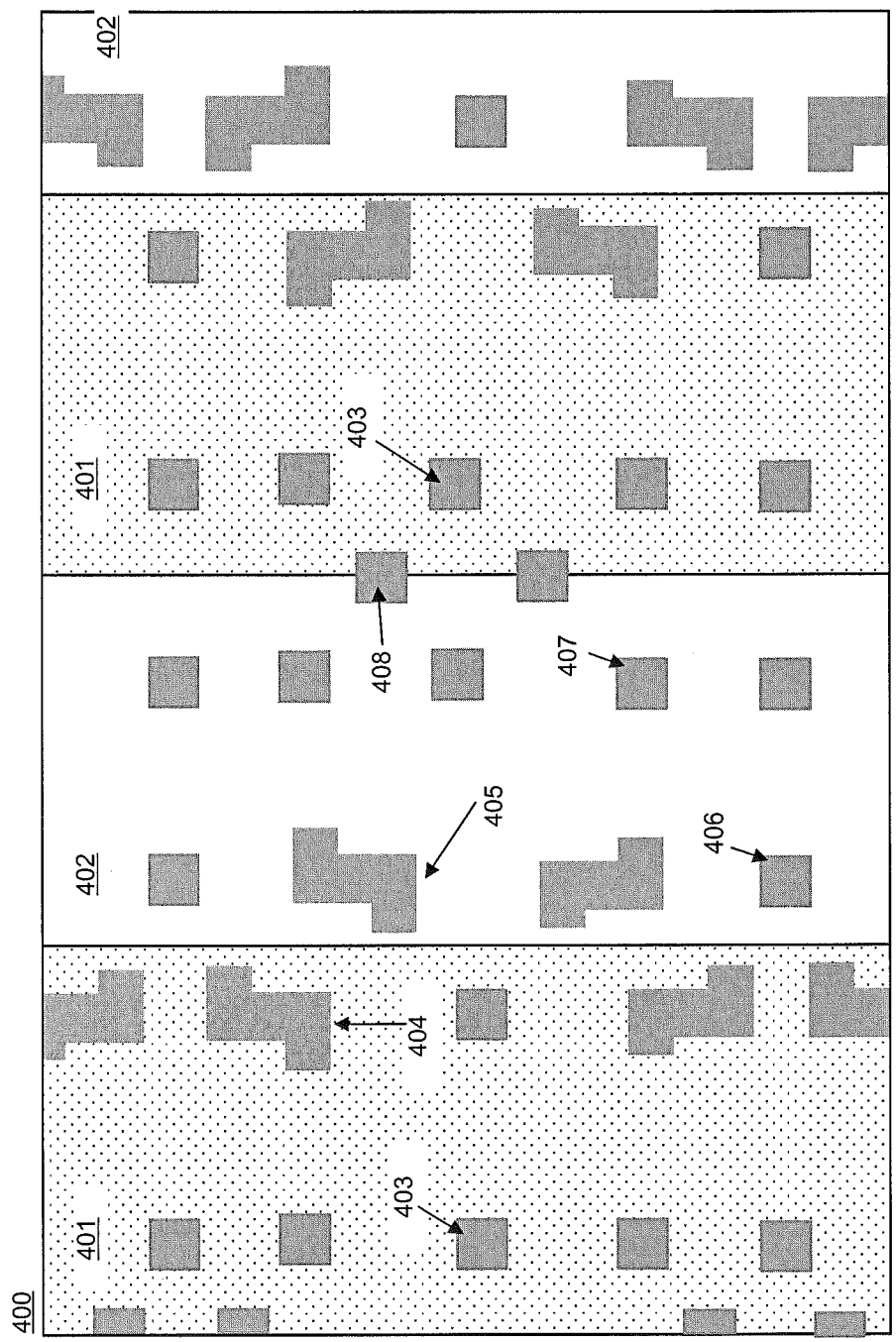
FIGS. 4A-B are top views of an embodiment of a SRAM test structure.

A second embodiment of a SRAM test structure 400 is shown in FIG. 4A. SRAM test structure 400 includes p-type source/drain implant region 401 and ungrounded region 402. P-type source/drain implant region 401 includes CAs 403 and CArecs 404. There is no n-well located under the p-type source/drain implant region 401. In some embodiments, there may be no well underneath the p-type source/drain implant region 401; in other embodiments, there may be a p-well underneath the p-type source/drain implant region 401. Ungrounded region 402 includes CArecs 405, VDD CAs 406, and CAs 407, which may be node CAs or bit line CAs or ground CAs. Ungrounded region 402 may include an undoped region or an n-type source/drain implant region in various embodiments. Word line CAs 408 straddles the p-type source/drain implant region 401 and the ungrounded region 402. During EBI, which induces a positive charge, the CAs 403 and CArecs 404 in the p-type source/drain implant region 401 will be grounded to the p-type substrate, and will appear bright. If any of CArecs 405 or CAs 406 or 407 also appear bright during EBI, the presence of a leakage path, which may be a gate line or a subway short, is indicated.

Figure 4B:
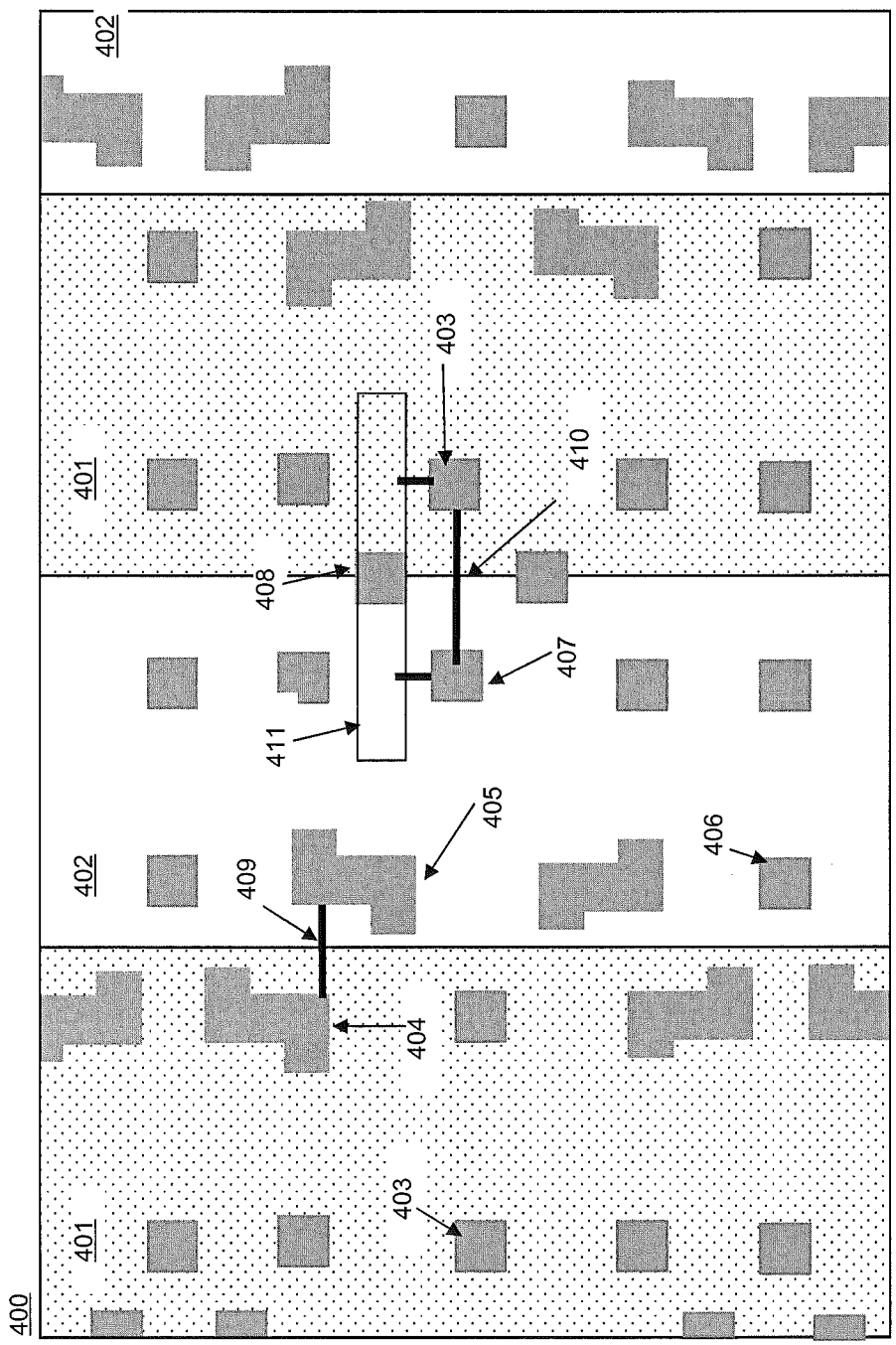

Some example shorts in the test structure 400 that may be detected using EBI are shown in FIG. 4B. Subway short 409 connects a CArec 405 in the ungrounded region 402 with a CArec 404 in the p-type source/drain implant region 401. Subway short 410 connects a CA 407 (which may comprise a bit line CA or a node CA or a ground CA) in the ungrounded region 402 with a CA 403 in the p-type source/drain implant region 401. Subway short 410 may be distinguished from a short to gate line 411, which also connects a CA 407 (which may comprise a bit line CA or a node CA or a ground CA) in the ungrounded region 402 to a CA 403 in the p-type source/drain implant region 401, because wordline CA 408 on gate line 411 will also appear bright under EBI.

Figure 5:
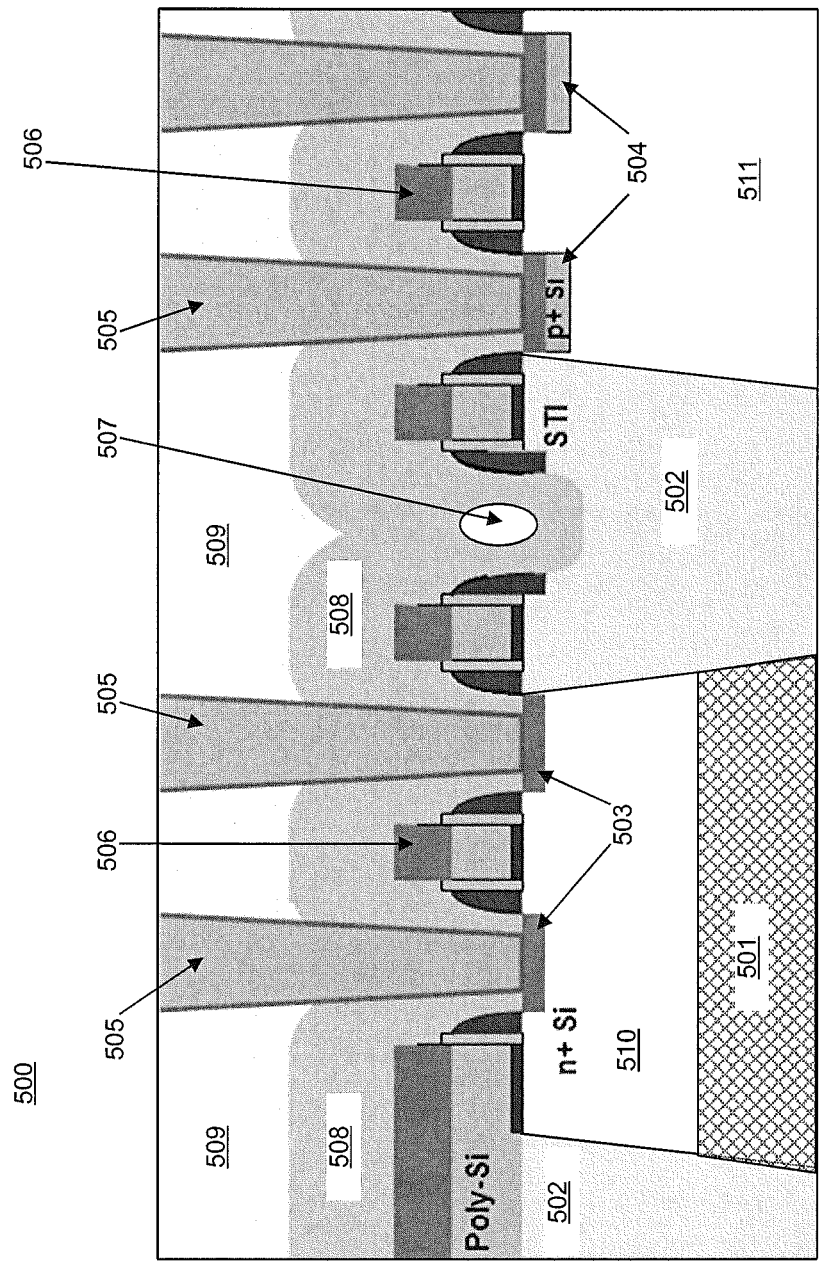
FIG. 5 is a cross-sectional view of an embodiment of a SRAM test structure.

FIG. 5 shows a cross-section of an embodiment of a SRAM test structure 500 showing the p-type source/drain region 504 with the n-well omitted. SRAM test structure 500 includes a p-type substrate 501, with STI regions 502 formed in the substrate 501. Source/drain regions, including n-type source/drain implanted regions 503 located in p-type wells 510, and p-type source/drain regions 504, and gate stacks 106 are formed on the p-type substrate 501. There is no n-well located underneath p-type source/drain regions 504. Region 511 may be undoped in some embodiments, or may be a p-well in other embodiments. Contacts 505 contact the source/drain regions 503/504. The SRAM test structure 500 is covered in contact dielectric layers, including nitride layer 508 and oxide layer 509. Void 507 occurs during formation of the nitride contact dielectric layer 508, and runs parallel to gate stacks 506. A p-type source/drain region 504 with no n-well located under the p-type source/drain region 504, as is shown in FIG. 5, is included in the embodiments of SRAM test structures discussed above with respect to FIGS. 3A-B and 4A-B.

FIG. 6 is a flowchart of a method 600 for subway detection in a SRAM device using a test structure. In block 601, a SRAM test structure is fabricated in a SRAM manufacturing environment, using SRAM manufacturing techniques. In particular, the SRAM test structure includes contact dielectric layers; during formation of these contact dielectric layers, subway formation may occur. The test structure may correspond to test structure 300 of FIGS. 3A-B, or test structure 400 of FIGS. 4A-B. The test structure has an ungrounded region that is distinct from the p-type source/drain implant region, as was shown in FIGS. 3A-B and 4A-B, and the n-well is omitted from the p-type source/drain implant region, as was shown in FIG. 5. Then, in block 602, the SRAM test structure is inspected for shorts using EBI. When the test structure is subjected to EBI, CAs (and in some embodiments, CArecs) in the p-type source/drain implant region are grounded and appear bright, and CAs and/or CArecs in the ungrounded region also appear bright if they are shorted to a CA or CArec in the p-type source/drain implant region. Different types of shorts (i.e., subways versus gate line shorts) may be distinguished from one another based on the EBI as discussed above with respect to FIGS. 3B and 4B. In block 603, the process window for filling in the contact dielectric layers may be assessed using the subway data gathered during the EBI of block 602 so as to reduce subway formation during formation of the contact dielectric layers in the SRAM manufacturing environment.

The technical effects and benefits of exemplary embodiments include detection and identification of various types of shorts, including subway shorts, in a SRAM manufacturing process using a SRAM test structure.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A static random access memory (SRAM) test structure, comprising:
   a p-type source/drain implant region comprising contacts (CAs) located in the p-type source/drain implant region, wherein the CAs in the p-type source/drain implant region comprise a first plurality of bit line, ground, and node CAs in the SRAM test structure, and wherein the CAs in the p-type source/drain implant region are grounded during an inspection of the SRAM test structure; and
   an ungrounded region, the ungrounded region being distinct from the p-type source/drain implant region and being ungrounded during the inspection of the SRAM test structure, the ungrounded region comprising contacts (CAs) and rectangular contacts (CArecs) comprising a second plurality of bit line, ground, and node CAs, and further comprising a first plurality of $V_{dd}$ CAs and rectangular contacts (CArecs), wherein a CArec simultaneously contacts a gate line and a source/drain, and wherein a CA or CArec in the ungrounded region is grounded during the inspection in the event of a short to a CA in the p-type source/drain implant region.

2. The SRAM test structure of claim 1, wherein there is not a well under the p-type source/drain implant region.

3. The SRAM test structure of claim 1, wherein there is a p-well under the p-type source/drain implant region.

4. The SRAM test structure of claim 1, wherein the ungrounded region comprises one of an n-type source/drain implant region and an undoped region.

5. The SRAM test structure of claim 1, wherein the p-type source/drain implant region further comprises a second plurality of CArecs and $V_{dd}$ CAs.

6. The SRAM test structure of claim 1, wherein a topology of the SRAM test structure, comprising shallow trench isolation (STI) regions and spacer shape, in the p-type source/drain implant region is determined by one of a Boolean method or a custom layer method.

7. The SRAM test structure of claim 1, wherein the short comprises a short between a CA in the p-type source/drain implant region and a CA not located in the p-type source/drain implant region, and in the event a CArec not located in the p-type source/drain implant region that contacts a gate line that is also contacted by the CA not located in the p-type source/drain implant region is grounded, the short is a contact-to-gate line short; and otherwise the short is a subway in a contact dielectric layer of the SRAM test structure.

8. The SRAM test structure of claim 7, wherein the CA not located in the p-type source/drain implant region comprises a $V_{dd}$ contact.

9. The SRAM test structure of claim 1, wherein the short comprises a short between a CA in the p-type source/drain implant region and a CA not located in the p-type source/drain implant region, and in the event a word line CA that contacts a gate line that is also contacted by the CA not located in the p-type source/drain implant region is grounded, the short is a contact-to-gate line short; and otherwise the short is a subway in a contact dielectric layer of the SRAM test structure.

10. The SRAM test structure of claim 9, wherein the CA not located in the p-type source/drain implant region comprises one of a bit line contact and a node contact.

11. The SRAM test structure of claim 1, wherein the short comprises a short between a CA in the p-type source/drain implant region and a first CArec not located in the p-type source/drain implant region, and in the event a second CArec not located in the p-type source/drain implant region that contacts a gate line that is also contacted by the first CArec not located in the p p-type source/drain implant region is grounded, the short is a contact-to-gate line short; and otherwise the short is a subway in a contact dielectric layer of the SRAM test structure.

12. The SRAM test structure of claim 11, wherein the inspection comprises e-beam inspection.

13. A method for short detection using SRAM test structure, comprising:
inspecting the SRAM test structure to detect the presence of a short, wherein the SRAM test structure comprises:
a p-type source/drain implant region comprising contacts (CAs) located in the p-type source/drain implant region, wherein the CAs in the p-type source/drain implant region comprise a first plurality of bit line, ground, and node CAs in the SRAM test structure, and wherein the CAs in the p-type source/drain implant region are grounded during an inspection of the SRAM test structure; and
an ungrounded region, the ungrounded region being distinct from the p-type source/drain implant region and being ungrounded during the inspection of the SRAM test structure, the ungrounded region comprising contacts (CAs) and rectangular contacts (CArecs) comprising a second plurality of bit line, ground, and node CAs, and further comprising a first plurality of $V_{dd}$ CAs and rectangular contacts (CArecs), wherein a CArec simultaneously contacts a gate line and a source/drain, and wherein a CA or CArec in the ungrounded region is grounded during the inspection in the event of a short to a CA in the p-type source/drain implant region; and
determining whether the detected short comprises a subway in a contact dielectric layer of the SRAM test structure or a contact-to-gate line short based on the inspection.

14. The method of claim 13, wherein there is not an n-well under the p-type source/drain implant region.

15. The method of claim 13, wherein the ungrounded region comprises one of a n-type source/drain implant region and an undoped region.

16. The method of claim 13, wherein the p-type source/drain implant region further comprises a second plurality of CArecs and $V_{dd}$ CAs.

17. The method of claim 13, wherein the short comprises a short between a CA in the p-type source/drain implant region and a CA not located in the p-type source/drain implant region, and in the event a CArec not located in the p-type source/drain implant region that contacts a gate line that is also contacted by the CA not located in the p-type source/drain implant region is grounded, the short is a contact-to-gate line short; and otherwise the short is a subway in a contact dielectric layer of the SRAM test structure.

18. The method of claim 17, wherein the CA not located in the p-type source/drain implant region comprises a $V_{dd}$ contact.

19. The method of claim 13, wherein the short comprises a short between a CA in the p-type source/drain implant region and a CA not located in the p-type source/drain implant region, and in the event a word line CA that contacts a gate line that is also contacted by the CA not located in the p-type source/drain implant region is grounded, the short is a contact-to-gate line short; and otherwise the short is a subway in a contact dielectric layer of the SRAM test structure, wherein the CA not located in the p-type source/drain implant region comprises one of a bit line contact and a node contact.

20. The method of claim 13, wherein the short comprises a short between a CA in the p-type source/drain implant region and a first CArec not located in the p-type source/drain implant region, and in the event a second CArec not located in the p-type source/drain implant region that contacts a gate line that is also contacted by the first CArec not located in the p p-type source/drain implant region is grounded, the short is a contact-to-gate line short; and otherwise the short is a subway in a contact dielectric layer of the SRAM test structure.

* * * * *